US011828943B2

(12) United States Patent
Joung et al.

(10) Patent No.: US 11,828,943 B2
(45) Date of Patent: Nov. 28, 2023

(54) DISPLAY PANEL AND HEAD MOUNTED DISPLAY DEVICE HAVING THE SAME

(71) Applicant: LG Display Co., Ltd., Seoul (KR)

(72) Inventors: Seung-Ryong Joung, Seoul (KR); Sang-Hun Han, Gunpo-si (KR); Ahn-Ki Kim, Busan (KR); Hong-Seok Choi, Seoul (KR); Yoon-Deok Han, Yongin-si (KR); Gyeong-Woo Kim, Seoul (KR); Jun-Ho Lee, Seoul (KR); Hee-Su Byeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 378 days.

(21) Appl. No.: 17/127,390

(22) Filed: Dec. 18, 2020

(65) Prior Publication Data

US 2021/0199972 A1 Jul. 1, 2021

(30) Foreign Application Priority Data

Dec. 31, 2019 (KR) ........................ 10-2019-0180177

(51) Int. Cl.
| | |
|---|---|
| *G02B 27/01* | (2006.01) |
| *H10K 50/81* | (2023.01) |
| *H10K 50/82* | (2023.01) |
| *H10K 50/844* | (2023.01) |
| *H10K 50/852* | (2023.01) |
| *H10K 59/12* | (2023.01) |
| *H10K 59/38* | (2023.01) |
| *H10K 77/10* | (2023.01) |

(52) U.S. Cl.
CPC ......... *G02B 27/0172* (2013.01); *H10K 50/81* (2023.02); *H10K 50/82* (2023.02); *H10K 50/844* (2023.02); *H10K 50/852* (2023.02); *H10K 59/12* (2023.02); *H10K 59/38* (2023.02); *H10K 77/10* (2023.02); *G02B 2027/0132* (2013.01); *G02B 2027/0178* (2013.01)

(58) Field of Classification Search
CPC ...... H10K 50/81; H10K 50/82; H10K 50/844; H10K 50/852; H10K 59/12; H10K 59/38; H10K 77/10; H10K 50/814; H10K 50/818; H10K 59/32; H10K 50/805; H10K 50/856; H10K 59/35; H10K 50/13; G02B 27/0172; G02B 2027/0132; G02B 2027/0178; G02B 2027/0118; G02B 27/01; G02B 30/22; Y02E 10/549
See application file for complete search history.

(56) References Cited

U.S. PATENT DOCUMENTS

| | | | |
|---|---|---|---|
| 11,088,237 B2 * | 8/2021 | Lee | H10K 50/81 |
| 2020/0044177 A1 * | 2/2020 | Kim | H10K 59/123 |
| 2020/0212130 A1 * | 7/2020 | Kim | H10K 59/123 |
| 2021/0202628 A1 * | 7/2021 | Kim | H10K 59/38 |
| 2021/0217831 A1 * | 7/2021 | Jung | H10K 59/122 |
| 2021/0305322 A1 * | 9/2021 | Song | H01L 27/1237 |

FOREIGN PATENT DOCUMENTS

KR 10-2019-0063618 A 6/2019

\* cited by examiner

*Primary Examiner* — Kevin Quarterman
(74) *Attorney, Agent, or Firm* — Birch, Stewart, Kolasch & Birch, LLP

(57) ABSTRACT

Disclosed are a display panel which changes the inner structure of an organic light emitting stack and a color transmission structure so as to improve luminance, and a head mounted display device using the same.

20 Claims, 7 Drawing Sheets

DISPLAY PANEL AND HEAD MOUNTED DISPLAY DEVICE HAVING THE SAME

CROSS-REFERENCE TO RELATED APPLICATIONS

This application claims the priority benefit of Korean Patent Application No. 10-2019-0180177, filed in the Republic of Korea on Dec. 31, 2019, the entire contents of which are hereby expressly incorporated by reference as if fully set forth herein into the present application.

BACKGROUND OF THE INVENTION

Field of the Invention

The present invention relates to a display device, and more particularly, to a display panel which changes the inner structure of an organic light emitting stack and a color transmission structure so as to realize structural simplification and increase luminance, and further relates to a head mounted display device including the display panel.

Discussion of the Related Art

As our society has entered the information age, the field of displays for visually displaying electrical information signals has rapidly developed. In order to satisfy such development, various flat display devices having excellent performance, such as slimness, light weight and low power consumption, have been developed and have rapidly replaced conventional cathode ray tubes (CRTs).

As examples of flat display devices, there are a liquid crystal display (LCD) device, a plasma display panel (PDP) device, a field emission display (FED) device, an organic light emitting diode (OLED) display device, a quantum dot display device, etc.

Thereamong, self-luminous display devices which do not require separate light sources and achieve compactness and clear color display, such as an organic light emitting diode display device, are considered as competitive applications.

The range of application of display devices is gradually expanding, and thus display devices are not only applicable to monitors and TVs but also are applicable as display devices that are wearable by users or mounted on users, i.e., mounted or wearable display devices.

These mounted or wearable display devices have tendencies different from those of large-area display devices with respect to viewing angle, luminance and the arrangement density of pixels thereof. Thus, in order to realize high integration and high luminance, the development of a device having a structure different from that of a flat display device, such as a general monitor or TV, is needed.

SUMMARY OF THE INVENTION

Accordingly, the present invention is directed to a display panel which changes the inner structure of an organic light emitting stack and a color transmission structure so as to realize structural simplification and increase luminance, and a head mounted display device including the same that substantially obviate one or more problems due to limitations and disadvantages of the related art.

An object of the present invention is to provide a display panel having a top emission-type microcavity resonance structure which realizes structural simplification and improves transmission characteristics by changing the structure of a plurality of stacks in an organic light emitting stack between an anode and a cathode and a resonance structure between the exit side of the organic light emitting stack and a reflective plate, and a head mounted display device including the same.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a display panel includes a substrate configured to have first to third subpixels, reflective plates provided on the substrate, a first anode provided in the first subpixel and configured to have a first distance from the reflective plate, a second anode provided in the second subpixel and configured to contact the reflective plate, a third anode provided in the third subpixel and configured to contact the reflective plate or to have the first distance from the reflective plate, an organic light emitting stack provided on the first to third anodes and including a plurality of stacks respectively having light emitting layers and a charge generation layer interposed between the stacks, a cathode provided on the organic light emitting stack, and a color conversion medium provided on the cathode located in the third subpixel.

The above-described display panel can be used in a head mounted display device including a receiving structure configured to receive the display panel.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
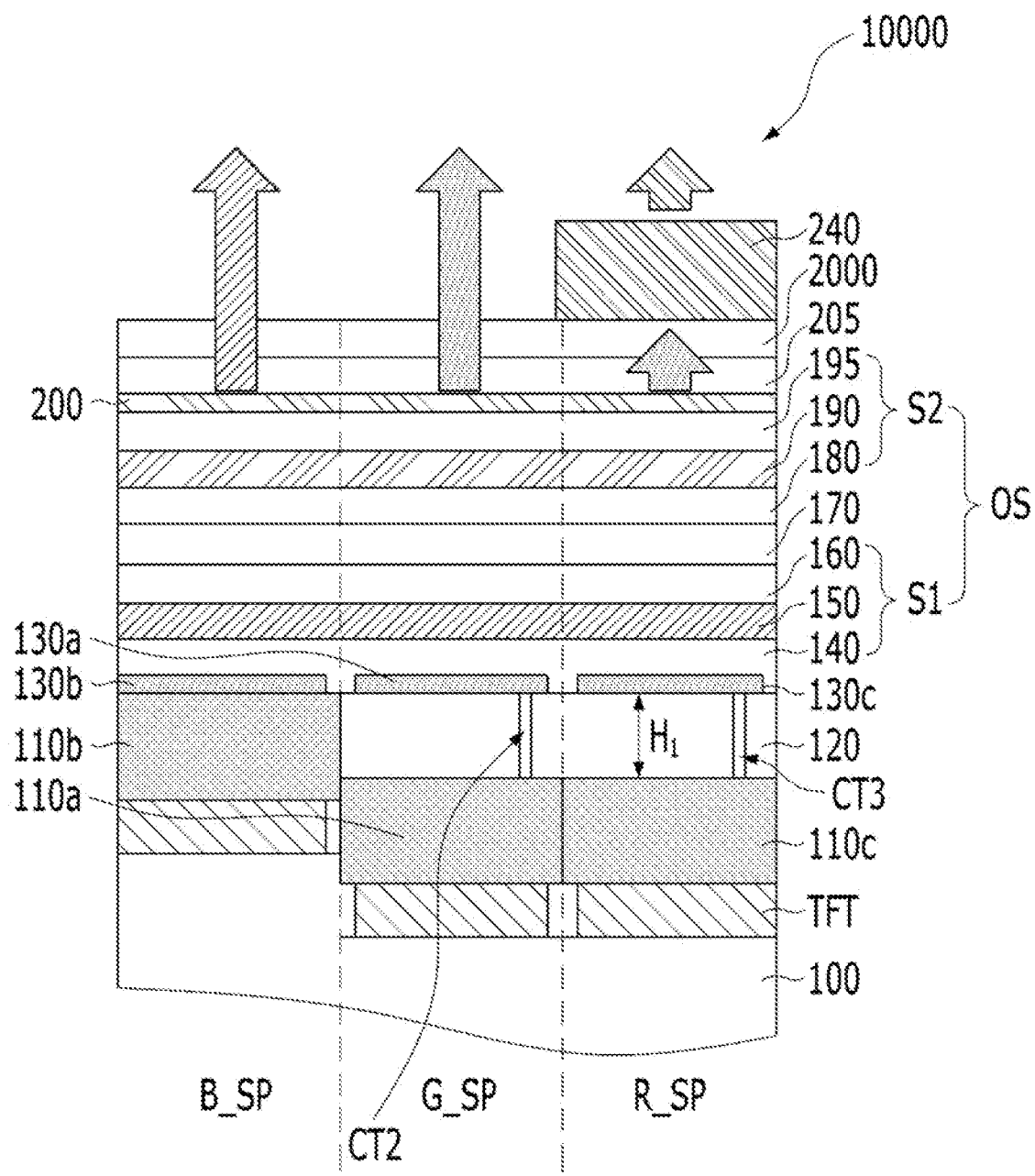
FIG. 1 is a cross-sectional view illustrating a display panel according to a first embodiment of the present invention.

Reference will now be made in detail to the exemplary embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it can make the subject matter of the present invention rather unclear. Further, the names of elements used in the following description of the embodiments of the present invention are selected in consideration of ease of preparation of the specification, and can thus differ from the names of parts of an actual product.

The shapes, sizes, ratios, angles and numbers of elements given in the drawings to describe the embodiments of the present invention are merely exemplary, and thus, the present invention is not limited to the illustrated details. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In the interpretation of elements included in the various embodiments of the present invention, it is to be interpreted that quantitative descriptions of characteristics of the elements include error ranges unless stated otherwise.

In the following description of the embodiments, it will be understood that, when positional relationships are expressed, for example, when an element is said to be "on", "above", "under" or "beside" another element, the two elements can directly contact each other, or one or more other elements can be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to distinguish the same or similar elements. Therefore, a first element described hereinafter could be termed a second element without departing from the technical scope of the invention.

Respective features of the various embodiments of the present invention can be partially or wholly coupled to or combined with each other and be interlocked or driven in various technical manners, and the respective embodiments can be implemented independently of each other or be implemented together through connection therebetween.

Among the elements that will be described below, an organic light emitting device array and a display panel will be described first.

In the following description of the present invention, the organic light emitting device array includes an array of a plurality of subpixels, having organic light-emitting devices configured to emit light of different colors, arranged on a substrate in consideration of optical characteristics thereof, and the display panel includes driving thin film transistors in the respective subpixels so as to drive the organic light-emitting device array in the respective subpixels. Here, the driving thin film transistor is connected to one electrode of the organic light emitting device in each subpixel.

Further, in a head mounted display device according to the present invention, a display panel is provided so as to correspond to each of two eyes. Further, the display panel independently corresponding to each of the left and right eyes can be mounted in a receiving structure.

Hereinafter, the exemplary embodiments of the present invention will be described with reference to the accompanying drawings.

FIG. 1 is a cross-sectional view illustrating a display panel according to a first embodiment of the present invention. All the components of the display panel according to all embodiments of the present invention are operatively coupled and configured.

As shown in FIG. 1, a display panel 10000 according to the first embodiment of the present invention includes a substrate 100 having first to third subpixels G_SP, B_SP and R_SP, reflective plates 110a, 110b and 110c provided respectively in the first to third subpixels G_SP, B_SP and R_SP on the plate 100, a first anode 130a provided in the first subpixel G_SP (e.g., green subpixel) and having a first distance H1 from the reflective plate 110a, a second anode 130b provided in the second subpixel B_SP (e.g., blue subpixel) and contacting the reflective plate 110b, a third anode 130c provided in the third subpixel R_SP (e.g., red subpixel) and having the first distance H1 from the reflective plate 110c, an organic light emitting stack OS provided on the first to third anodes 130a, 130b and 130c and including a plurality of stacks S1 and S2 respectively having light emitting layers 150 and 190 and a charge generation layer 170 interposed between the stacks S1 and S2, a cathode 200 provided on the organic light emitting stack OS, and a color conversion medium 240 provided on the cathode 200 located in the third subpixel R_SP.

The positions of the above-described first to third subpixels G_SP, B_SP and R_SP can be changed. However, it is appropriate for the second subpixel R_SP, in which the second anode 130b contacting the reflective plate 110b is located, to emit light of the shortest wavelength and for the remaining first and third subpixels G_SP and B_SP to emit light of longer wavelengths than the wavelengths of the light emitted by the second subpixel B_SP so as to allow the organic light emitting stack OS to satisfy microcavity characteristics of the light emitted by the second subpixel R_SP and to convert light emitted by the organic light emitting stack OS in the third subpixel R_SP to light of longer wavelengths than the wavelengths thereof. Therefore, it is appropriate for the second subpixel B_SP, in which the reflective plate 110b contacts the second anode 130b, to be a blue subpixel.

The organic light emitting stack OS includes two or more light emitting layers which emit light of different colors, and the light emitting layers are present in different stacks so as not to contact each other.

In the example shown in FIG. 1, the organic light emitting stack OS is formed in common in the first to third subpixels G_SP, B_SP and R_SP in a tandem manner, and in this case, the organic light emitting stack OS is not separated into the subpixels G_SP, B_SP and R_SP and thus respective common layers and light emitting layers can be formed using open masks having identical or similar openings at least in the active area of the substrate 100 without a fine metal mask (FMM).

In the display panel 10000 according to the first embodiment of the present invention, the organic light emitting stack OS includes a first common layer 140, a first light emitting layer 150, a second common layer 160, a charge generation layer 170, a third common layer 180, a second light emitting layer 190 and a fourth common layer 195, which are sequentially formed on the first to third anodes 130*a*, 130*b* and 130*c*.

The first common layer 140 and the third common layer 180 are layers relating to hole injection and/or hole transport, and serve to transmit holes to the first light emitting layer 150 and the second light emitting layer 190 adjacent thereto.

The second common layer 160 and the fourth common layer 195 are layers relating to electron injection and/or electron transport, and serve to transmit electrons to the first light emitting layer 150 and the second light emitting layer 190 adjacent thereto.

These first to fourth common layers 140, 160, 180 and 195 can include a plurality of layers based on the functions thereof. Further, in the display panel 10000 according to the present invention, not only the first to fourth common layers 140, 160, 180 and 195 having functions of injecting and transporting holes and electrons but also the first and second light emitting layers 150 and 190 and the charge generation layer 170 are not separated into the subpixels G_SP, B_SP and R_SP and can be formed integrally so as to cover the entirety of the subpixels G_SP, B_SP and R_SP.

Here, the respective stacks S1 and S2 mean units which are separated by the charge generation layer 170, and each of the stacks S1 and S2 includes the light emitting layer 150 or 190 and the common layers 140 and 160 or 180 and 195 provided on and under the light emitting layer 150 or 190.

In the example shown in FIG. 1, the first light emitting layer 150 can be a blue light emitting layer which emits light with a peak wavelength in the range of 435 nm to 475 nm, and the second light emitting layer 190 can be a green light emitting layer or a yellowish-green light emitting layer which emits light with a peak wavelength in the range of 500 nm to 590 nm. This is merely one example, the positions of the blue light emitting layer and the green (or yellowish) light emitting layer can be exchanged.

The color conversion medium 240 converts light emitted by the organic light emitting stack OS into light having longer wavelengths than the wavelengths of light emitted by the first and second light emitting layers 150 and 190 and then emits the light. For example, the color conversion medium 240 functions to convert blue light and green light emitted by the organic light emitting stack OS into red light and then to emit the red light. For example, light emitted by the third subpixel R_SP via the color conversion medium 240 can be light having a peak wavelength in the range of 600 nm to 650 nm.

A capping layer 205 configured to improve light emission ability and to protect light emitting diodes including the first to third anodes 130*a*, 130*b* and 130*c*, the organic light emitting stack OS and the cathode 200, and an encapsulation layer structure 2000 configured to completely cover the upper and side surfaces of the entirety of the organic light emitting diodes to prevent moisture permeation from the outside.

The color conversion medium 240 can be provided on the encapsulation layer structure 2000.

The color conversion medium 240 can be formed by coating the encapsulation layer structure 2000 with a liquid, for example, formed by dissolving an organic resin including a color conversion material in a solvent, and then pattering an obtained layer so as to remain on the encapsulation layer structure 2000 only in the third subpixel R_SP. The solvent is removed by volatilization, and thus, the color conversion medium 240 finally has a structure in which the organic resin is filled with the color conversion material.

In some cases, the color conversion medium 240 can be formed by coating the encapsulation layer structure 2000 with a mixture of the solvent and a color conversion material and pattering an obtained layer so as to remain on the encapsulation layer structure 2000 only in the third subpixel R_SP. In this case, after volatilization of the solvent, only the color conversion material including a group of nanoparticles can finally remain in the color conversion material 240. In another example, the color conversion medium 240 can be configured such that a color conversion material including a group of nanoparticles is confined by a resin layer. The organic resin can include an acryl-based or amide-based material.

The color conversion material can include at least one selected from the group consisting of inorganic fluorescent substances, organic fluorescent substances, quantum dots and organic dyes. Further, for example, the color conversion medium 240 can include at least one of $PbS$, $PbS_2$, $PbSe$, $CdSe$, $CdS$, $CdTe$, $InAs$ or $InP$, and these materials can transmit light of designated wavelengths using a difference in sizes of particles. For example, particles having larger sizes can transmit incident light having longer wavelengths. However, this is merely one example, and the wavelengths of light to be transmitted through color conversion can be adjusted by changing materials.

Further, the organic light emitting stack OS is adjusted to allow blue light emitted by the second subpixel B_SP to have microcavity characteristics. In the second subpixel B_SP, the reflective plate 110*b* contacts the second anode 130*b*, and thus, the microcavity characteristics of the organic light emitting stack OS are adjusted so as to satisfy the luminescent characteristics of the second subpixel B_SP. Therefore, the second subpixel B_SP directly transmits blue light via the organic light emitting stack OS, the cathode 200, the capping layer 205 and the encapsulation layer structure 2000 without a color filter.

Here, the capping layer 205 and the encapsulation layer structure 2000 are formed of materials having optical transmittance of 90% or higher, and can thus transmit light emitted by the cathode 2000 without loss.

In the first subpixel G_SP of the display panel 10000 according to the present invention, the reflective plate 110*a* is spaced apart from the first anode 130*a* by the first distance $H_1$, and for this purpose, a cavity adjustment layer 120 configured to form the first distance $H_1$ is further provided between the reflective plate 110*a* and the first anode 130*a*.

The resonance effect occurs in the distance $H_1$ between the upper surface of the reflective plate 110*a* and the cathode 200 formed by the cavity adjustment layer 120, and light having different microcavity characteristics from the second subpixel B_SP, i.e., light having microcavity characteristics in green light wavelengths, is transmitted. Therefore, in the first subpixel G_SP, green light is directly transmitted through the encapsulation layer structure 2000 without a color filter layer.

The cavity adjustment layer 120 can be formed of, for example, $SiN_x$ or $SiO_x$.

Further, in the same manner as in the first subpixel G_SP, the cavity adjustment layer 120 configured to form the first distance $H_1$ between the reflective plate 110*c* and the first anode 130*c* is further provided in the third subpixel R_SP, and thereby, light having passed through the organic light emitting stack OS and then passed through the cathode 200, the capping layer 205 and the encapsulation layer structure 2000 can be emitted as green light through the encapsulation layer structure 2000 based on the microcavity characteristics imparted to the first subpixel G_SP, but the green light can be converted into red light by the color conversion medium 240 provided on the encapsulation layer structure 2000.

A general color filter selectively transmits a specific wavelength band and absorbs the remaining wavelength bands and thus has light transmission efficiency of about ⅓, but the color conversion medium 240 converts incident light of short wavelengths into light of long wavelengths with light conversion efficiency of 60% to 80% and then transmits the light and thus has improved luminous efficacy compared to the color filter.

The color of light emitted by the first subpixel G_SP is determined by characteristics of a dopant provided in the first light emitting layer 150, and the color of light emitted by the second subpixel B_SP is determined by characteristics of a dopant provided in the second light emitting layer 190.

The second light emitting layer 190 can include a green, yellowish-green or yellow dopant having a peak wavelength in the range of 500 nm to 590 nm, and a phosphorescent dopant can be used. This dopant is a phosphorescent dopant. Compared to a structure in which a plurality of different kinds of phosphorescent light emitting layers contacting each other is provided in a phosphorescent light emitting stack using tandem white light emitting devices, the display panel 10000 according to the present invention has a single phosphorescent light emitting layer, i.e., the second light emitting layer 190, and thus, the second light emitting layer 190 alone in the second stack S2 uses excitons and luminous efficacy is remarkably increased.

On the other hand, the first light emitting layer 150 can use a blue fluorescent dopant. For example, a boron core dopant can be used as the blue fluorescent dopant. A blue fluorescent dopant material which has been developed to ensure both efficiency and a long lifespan is used as the blue florescent dopant, and if a blue phosphorescent dopant material is developed, the first light emitting layer 150 provided in the first stack S1 can include the blue phosphorescent dopant.

In the display panel 10000 according to the present invention, the reflective plates 110a, 110b and 110c are formed of a reflective metal including one of Ag, an Ag alloy, Al, an Al alloy and Ag:Pb:Cu (APC), and function as mirrors, the cathode 200 is formed of AgMg or an AgMg alloy, or is a transparent oxide electrode formed of indium tin oxide (ITO) or indium zinc oxide (IZO), and functions as a half mirror, and each of the respective subpixels G_SP, B_SP and R_SP amplifies and transmits light of specific wavelengths determined by a resonant length under the cathode 190, and repeatedly reflects light of other wavelengths between the reflective plates 110a, 110b and 110c and the cathode 200.

The respective reflective plates 110a, 110b and 110c are formed of a metallic material, and can connect the corresponding anodes 130a, 130b and 130c to thin film transistors TFT.

For example, in the second subpixel B_SP, the thin film transistor TFT can be connected to the reflective plate 130b through a first contact hole CT1 in an interlayer insulating film 107, and the reflective plate 110b can be directly connected to the second anode 130b.

In the first subpixel G_SP, the thin film transistor TFT can be directly connected to the reflective plate 110a, the reflective plate 110a can be spaced apart from the first anode 130a by the cavity adjustment layer 120, and the first anode 130a can be connected to the reflective plate 110b through a second contact hole CT2 provided in the cavity adjustment layer 120.

In the same manner as in the first subpixel G_SP, in the third subpixel R_SP, the thin film transistor TFT can be directly connected to the reflective plate 110c, the reflective plate 110c can be spaced apart from the third anode 130c by the cavity adjustment layer 120, and the second anode 130c can be connected to the reflective plate 110c through a third contact hole CT3 provided in the cavity adjustment layer 120.

For this conductive connection, the thin film transistors TFT, the reflective plates 110a, 110b and 110c and the first to third anodes 130a, 130b and 130c of the respective subpixels G_SP, B_SP and R_SP are separated from each other.

Figure 3:
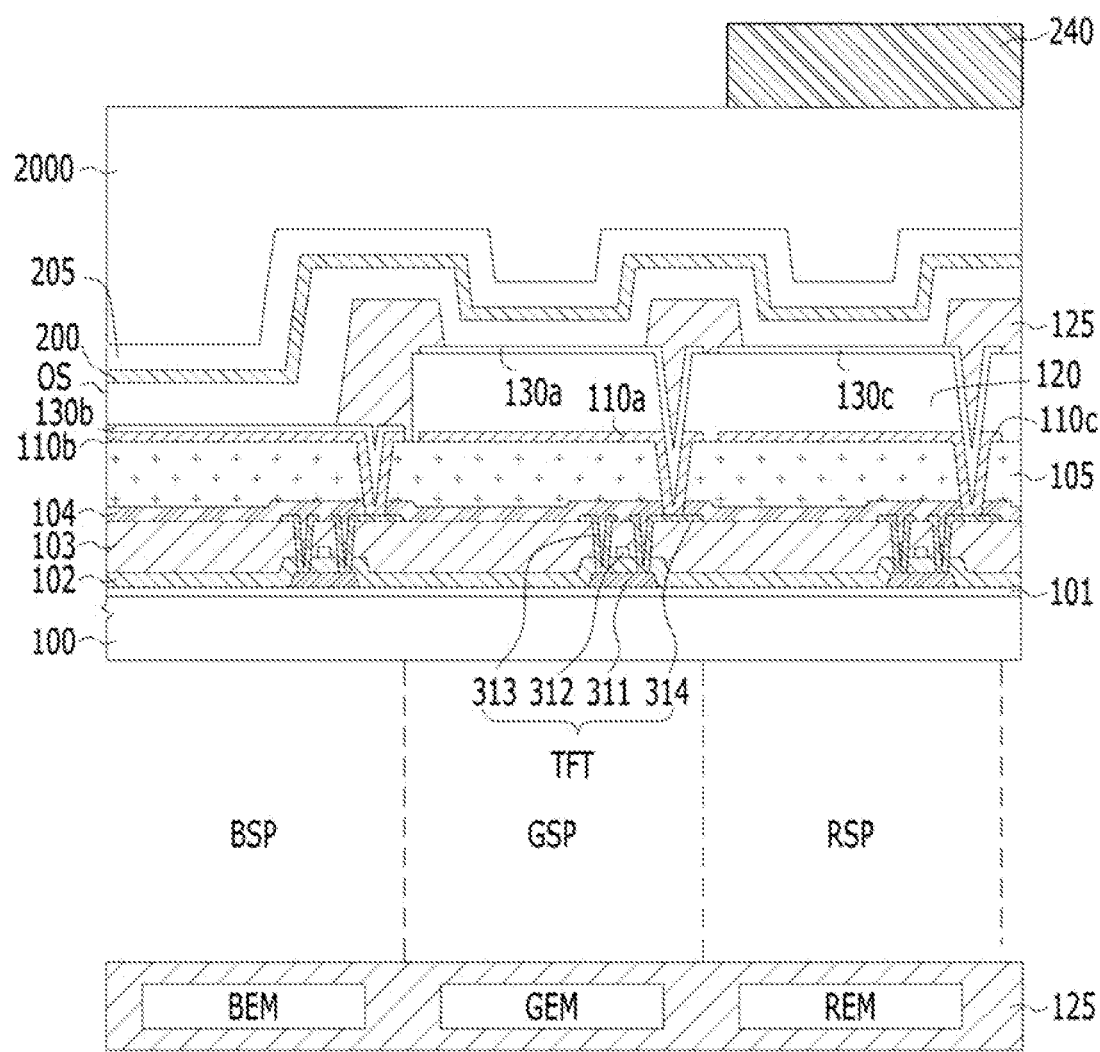
FIG. 3 is a cross-sectional view illustrating a modified example of the display panel of FIG. 1 in connection with a thin film transistor array.

The reflective plates 110a and 110c of the first and third subpixels G_SP and R_SP and the reflective plate 110b of the second subpixel B_SP are formed at different heights, as shown in FIG. 1, or the reflective plates 110a, 110b and 110c of the respective subpixels G_SP, B_SP and R_SP can be formed at the same height and planes on which the first and third anodes 130a and 130c and the second anode 130b are formed can be different due to a height difference formed by providing the cavity adjustment layer 120, as will be described in connection with a modified example shown in FIG. 3. FIG. 1 illustrates that the same configuration from the organic light emitting stack OS to the encapsulation layer structure 2000 is formed in the respective subpixels G_SP, B_SP and R_SP, the interlayer insulating film 107 can be omitted in some cases, and the surface of the second anode 130b can be lower than the surfaces of the first and third anodes 130a and 130c due to absence of the cavity adjustment layer 120.

In the present invention, the cathode 190 can be formed of AgMg or an alloy including AgMg so as to improve reflection characteristics between the cathode 190 and the reflective plates 110a, 110b and 110c and to increase strong microcavity characteristics based on the resonant lengths of the respective subpixels G_SP, B_SP and R_SP.

Therefore, when the light emitting layers 150 and 190 of the organic light emitting stack OS of the respective subpixels G_SP, B_SP and R_SP emit light, light transmitted upwards and downwards from the light emitting layers 150 and 190 is repeatedly reflected by the surfaces of the reflective plates 110a, 110b and 110c and the cathode 190, and specific wavelengths, determined depending on distances from the upper surfaces of the reflective plates 110a, 110b and 110c to the cathode 200, can be concentrated on the cathode 190 through strong cavity effects. In this case, on the assumption that a distance from the upper surface of the reflective plate 110a, 110b or 110c of each of the subpixels G_SP, B_SP and R_SP to the cathode 200 is d, a resonance condition of $2nd=m\lambda$ can be established (here, n is the average refractive index of the organic light emitting stack, m is an integer, and $\lambda$ is the wavelength of light causing microcavity characteristics in the corresponding subpixel and emitted by the cathode 200). In this case, the first subpixel G_SP and the second subpixel B_SP satisfy the above-described resonance condition in corresponding wavelengths of 500 nm to 590 nm and wavelengths of 435 nm to 475 nm, respectively. The distances d varying depending on the different wavelength $\lambda$ can be adjusted by the cavity adjustment layer 120.

The first to third anodes 130a, 130b and 130c used in the display panel 10000 according to the present invention can be the same transparent electrode, for example, a transparent electrode including at least one of indium (In), zinc (Zn), tungsten (W), molybdenum (Mo), titanium (Ti), cobalt (Co), copper (Cu), vanadium (V), chrome (Cr), germanium (Ge), nickel (Ni) or tantalum (Ta). Alternatively, each of the first to third anodes 130a, 130b and 130c can be a nitride film or silicide film including at least one of the above-described metals. In order to realize reflection and the resonance effect, the first to third anodes 130a, 130b and 130c can have light transmittance of about 80% so as to transmit light, traveling from the organic light emitting stack OS to the first to third anodes 130a, 130b and 130c, towards the reflective plates 110a, 110b and 110c, and can be subjected to surface treatment or further include a specific component so as to achieve stability of the interfaces with the organic light emitting stack OS and the cavity adjustment layer 120.

In the respective subpixels G_SP, B_SP and R_SP, reflection is performed starting from the upper surfaces of the reflective plates 110a, 110b and 110c, resonance is performed between the reflective plates 110a, 110 and 110c and the cathode 200 with different resonant lengths in the respective subpixels G_SP, B_SP and R_SP, and light is ultimately emitted through the cathode 200.

The cavity adjustment layer 120 has a difference in refractive index of 0.3 or less with a light-absorbing metal forming the first to third anodes 130a, 130b and 130c, the majority of light penetrates the cavity adjustment layer 120 during resonance of light between the reflective plates 110a, 110b and 110c and the cathode 200, and the thickness of the cavity adjustment layer 120 is added to the thickness of the organic light emitting stack OS so as to be used to determine resonant wavelengths of the corresponding subpixel.

Further, in the organic light emitting stack of FIG. 1, the cavity adjustment layer 120 can be formed only in the first and third subpixels G_SP and R_SP by patterning the same cavity adjustment layer material using a mask in which permeable parts and semi-permeable parts vary.

Further, the cavity adjustment layer 120 can be formed of a transparent inorganic insulating film, for example, an oxide film or a nitride film, or in some cases, a transparent electrode. In the latter case, the reflective plates 110a, 110b and 110c, the cavity adjustment layer 120, and the first to third anodes 130a, 130b and 130c form stack structures and come into surface contact with each other, thereby lowering the sheet resistance of the first to third anodes 130a, 130b and 130c.

In addition, the capping layer 205 can be formed by stacking an organic capping layer and an inorganic capping layer, and the encapsulation layer structure 2000 can be formed by alternately stacking at least one pair of an inorganic film and an organic film.

All of the inorganic film and the organic film forming the encapsulation layer structure 2000 can have thicknesses which are twice or more the thicknesses of the respective layers of the capping layer 205 and other structures provided thereunder so as to sufficiently cover and protect the structures provided under the encapsulation layer structure 2000, and particularly, the organic film in the encapsulation layer structure 2000 can have a thickness which is 10 times or more the thicknesses of the respective layers of the capping layer 205 and other structures provided thereunder so as to stably cover these layers even when particles are generated during processing or outgassing occurs therein. The encapsulation layer structure 2000 can have a single-layer structure including an inorganic film or an organic film, or have a structure in which inorganic films and organic films are alternately stacked into a plurality of pairs or N.5 pairs (N being a natural number) such that an inorganic film is disposed as the uppermost film of the encapsulation layer structure 2000. The inorganic films of the encapsulation layer structure 2000 can be, for example, oxide films or nitride films, or include a metal component having coverage, which is added thereto in an amount in which transparency is maintained, and have thicknesses of about 1 μm, and the organic films can be formed of organic materials so as to have thicknesses of about 10 μm. In the encapsulation layer structure 2000, the inorganic films are formed to have wider areas than the organic films, thereby preventing moisture permeation from the edge thereof.

Now, the effects of the display panel according to one or more embodiments of the present invention will be described.

The display panel according to one or more embodiments of the present invention is applicable to various applications, and is particularly advantageously applied to a wearable structure in which a display panel is located adjacent to viewer's eyes. The wearable structure, in which the distance between the viewer and the display panel is mechanically fixed, is not influenced by the viewing angle. However, in the wearable structure, the size of a screen is limited so that the display panel can be viewed at the fixed position of the viewer's eyes. In this case, if an FMM configured to vary a light emitting layer depending on the subpixel is used in order to realize a high resolution in a small area, a yield is lowered. Therefore, the display panel according to one or more embodiments of the present invention facilitates formation of all layers of the organic light emitting stack OS without the FMM. Thereby, a yield can be increased.

Further, in the organic light emitting stack OS including the first stack S1, which is a fluorescent light emitting stack, and the second stack S2, which is a phosphorescent light emitting stack, provided with the charge generation layer 170 interposed therebetween, the second stack S2 uses a single phosphorescent light emitting layer and maximizes usage of excitons by the phosphorescent light emitting layer, thereby being capable of improving luminous efficacy. In a structure, in which an organic light emitting stack is implemented as a white organic light emitting stack, a phosphorescent light emitting stack includes, for example, a red phosphorescent light emitting layer and a green phosphorescent light emitting layer contacting each other, but in the organic light emitting stack according to the present invention, the phosphorescent light emitting stack S2 includes the green (or yellowish-green) light emitting layer alone and such a light emitting layer exclusively uses excitons, thereby being capable of increasing luminous efficacy.

Further, the substrate 100 according to the present invention can be, for example, one of a transparent glass substrate, a transparent plastic substrate and a silicon substrate. If the substrate 100 is not required to be transparent and the display panel 10000 is implemented as a small panel having an ultra-high definition, use of a silicon substrate as the substrate 100 is advantageous for fine processes for forming the thin film transistors TFT, the reflective plates 110a, 110b and 110c and the first to third anodes 130a, 130b and 130c having the ultra-high definition.

Figure 2:
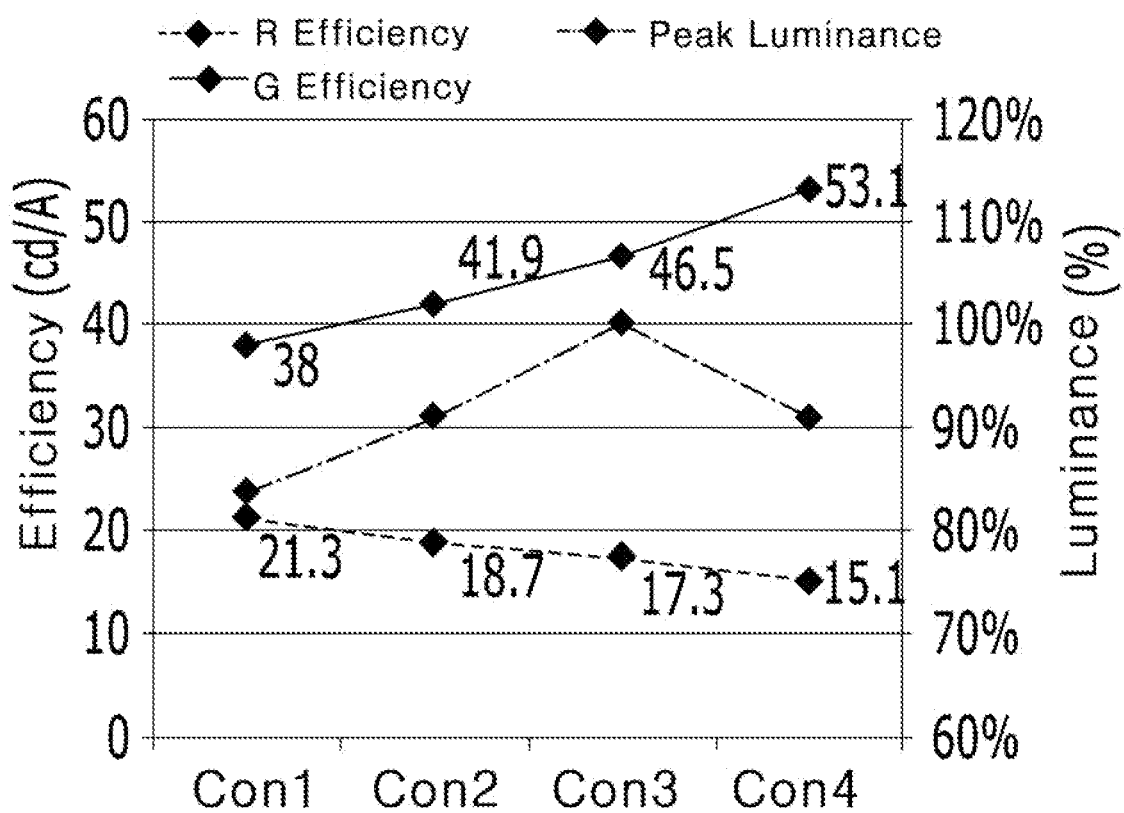
FIG. 2 is a graph showing peak luminance when efficiency of green light is increased and efficiency of red light is decreased if a phosphorescent light emitting stack is applied.

FIG. 2 is a graph showing peak luminance when efficiency of green light is increased and efficiency of red light is decreased if a phosphorescent light emitting stack is applied.

Referring to FIG. 2, when efficiency of green light is increased and efficiency of red light is decreased in a direction from Con 1 to Con 4, efficiency of white light is theoretically highly dependent on blue light and thus follows an increase in the efficiency of green light, but when the peak luminance reaches a designated level, the increase in the efficiency of green light does not influence the peak luminance but rather decreases the peak luminance (in Con 4). Further, it can be confirmed that, when the sum of light emitted by a red phosphorescent light emitting layer and light emitted by a green phosphorescent light emitting layer and blue light emitted by the blue light emitting stack S1 (in FIG. 1) are combined to produce white light, the peak luminance of white light is greatly lowered due to the red phosphorescent light emitting layer having low efficiency in Con 4.

Further, the graph of FIG. 2 shows that in the structure including the red phosphorescent light emitting layer and the green phosphorescent light emitting layer contacting each other, the respective phosphorescent light emitting layers uses excitons together to emit light, and thus have difficulty increasing the efficiencies of both red and green.

In the display panel according to the present invention including the organic light emitting stack OS having the blue fluorescent light emitting stack S1 and the phosphorescent light emitting stack S2, the phosphorescent light emitting stack S2 uses the single phosphorescent light emitting layer and does not cause sharing of excitons by different phosphorescent light emitting layers, thereby being capable of realizing the efficiency increase effect.

TABLE 1

|  | Comparative example (Con 3) | First test example | Second test example |
| --- | --- | --- | --- |
| Efficiency of red light (Cd/A) | 17.3 | 18.1 | 24.1 |
| Efficiency of green light (Cd/A) | 46.5 | 92.3 | 92.3 |
| Efficiency of blue light (Cd/A) | 3.5 | 5.6 | 5.6 |
| Peak luminance (%) | 100% | 117% | 156% |

As Table 1 shows the efficiencies of light of respective colors and peak luminances acquired by performing tests using a comparative example (Con 3) having the configuration of FIG. 2 including the red phosphorescent light emitting layer and the green phosphorescent light emitting layer contacting each other, and using a first test example and a second test example having the configuration of FIG. 1.

In the first test example and the second test example, the efficiencies of red light are different due to use of different materials for the color conversion medium 240, but the remaining elements thereof are the same. Particularly, in the first and second test examples, a single green light emitting layer is used as the second light emitting layer 190, the same elements between the anodes 130a, 130b and 130c and the cathode 200 are applied, the cavity adjustment layer 120 having the same thickness is applied between the reflective plate 110a and the first anode 130a of the green subpixel G_SP and between the reflective plate 110c and the third anode 130c of the red subpixel R_SP, and the blue subpixel B_SP is configured such that the reflective plate 110b and the second anode 130b contact each other.

In the comparative example, the red phosphorescent light emitting layer and the green phosphorescent light emitting layer contact each other in the phosphorescent light emitting stack (with reference to the position of the second stack S2 of FIG. 1), and distances between reflective plates and anodes are different in blue, green and red subpixels. The comparative example is the same as the first and second test examples in that the blue fluorescent light emitting stack is provided under the phosphorescent light emitting stack with the charge generation layer interposed therebetween. In the comparative example, the reflective plate and the anode contact each other in the blue subpixel, a cavity adjustment layer having a thickness corresponding to a first distance is provided in the green subpixel such that the anode is spaced apart from the reflective plate by the first distance, and a cavity adjustment layer having a thickness corresponding to a second distance greater than the first distance is provided in the red subpixel such that the anode is spaced apart from the reflective plate by the second distance. Further, a blue color filter layer, a green color filter layer and a red color filter layer are respectively provided on a cathode in the blue, green and red subpixels.

It can be confirmed that the efficiencies of red, green and blue light in the first test example and the second test example are increased compared to the comparative example. Particularly, in the first and second test examples according to the first embodiment of the present invention, from which color filter layers are omitted, efficiency of green light is increased by 98% or more and efficiency of blue light is increased by 60% or more compared to the comparative example.

Further, in comparison between the first and second test examples, it can be confirmed that, when the components of the color conversion medium 240 are different, efficiency of red light is improved due to an increase in the transmission intensity of red light.

In addition, in the first and second test examples according to the first embodiment of the present invention, color efficiency is increased such that both efficiency of red light and efficiency of green light are increased without a trade-off therebetween, and this means that expression of white light is facilitated without loss of a specific color.

FIG. 3 is a cross-sectional view illustrating a modified example of the display panel of FIG. 1 in connection with a thin film transistor array.

Referring to FIG. 3, the configuration of the thin film transistor array, which is formed in the display panel according to the present invention and has connections with the first to third anodes 130a, 130b and 130c, will be described.

As shown in FIG. 3, the display panel can include a buffer layer 101 provided on the substrate 100 on which the first to third subpixels G_SP, B_SP and R_SP are regularly disposed, driving thin film transistors 310 provided on the buffer layer 101 so as to respectively correspond to the first to third subpixels G_SP, B_SP and R_SP, and the above-described organic light emitting device array shown in FIG. 1 configured to be connected to the respective driving thin film transistors 310.

In the display panel according to the present invention, the substrate 100 can be, for example, one of a transparent glass substrate, a transparent plastic substrate and a silicon wafer substrate. Further, the substrate 100 can be mounted in a head mounted display device, and thus be formed of a flexible material bent depending on the curvature of a receiving part of the head mounted display device.

Further, if the substrate 100 is mounted in a head mounted display device so as to directly correspond to two viewer's eyes and the viewer views an augmented reality image through the head mounted display device, the substrate 100 can be transparent.

If the substrate 100 is mounted in a head mounted display device so as to directly correspond to two viewer's eyes and the viewer views a virtual reality image through the head mounted display device, the substrate 100 may not be transparent, for example, the substrate 100 can be a silicon wafer substrate. Further, if the substrate 100 is received in a head mounted display device so as not to directly correspond to two viewer's eyes but to correspond to the outsides of the viewer's eyes, the substrate may not be transparent.

Here, the respective driving thin film transistors 310 are conductively connected to the first to third anodes 130a, 130b and 130c.

Although the illustrated example shows that the reflective plates 110a, 110b and 110c are reflective electrodes and the first to third anodes 130a, 130b and 130c are conductively connected to the reflective plates 110a, 110b and 110c, the reflective plates 110a, 110b and 110c can use only optical reflection and thus may not be electrically conductive, and there can be no connections between the reflective plates 110a, 110b and 110c and the first to third anodes 130a, 130b and 130c.

In order to adjust distances between the upper surfaces of the reflective plates 110a and 110b and the cathode 200 in the first subpixel G_SP and the second subpixel B_SP, the second anode 130b is configured to contact the reflective plate 110b, and the first and third anodes 130a and 130c are spaced apart from the reflective plates 110a and 110c by the first distance $H_1$ formed by the cavity adjustment layer 120 between the first and third anodes 130a and 130c and the reflective plates 110a and 110c.

The driving thin film transistor 310 can include a semiconductor layer 311 provided in a designated region of the buffer layer 101, a gate electrode 312 which partially overlaps the semiconductor layer 311 with a gate insulating film 102 interposed between the semiconductor layer 311 and the gate electrode 312, and a source electrode 313 and a drain electrode 314 which are connected to both sides of the semiconductor layer 311.

Although the illustrated example shows a top gate structure in which the gate electrode 312 is located on the semiconductor layer 311, the present invention is not limited thereto, and a bottom gate structure in which a gate electrode is located under a semiconductor layer can be realized.

Further, the semiconductor layer 311 can be a polysilicon layer, an amorphous silicon layer, an oxide semiconductor layer, or a combination of some thereof, and in some cases, can be implemented so as to have crystallinity in regions other than channels.

An interlayer insulating film 103 is further provided on the gate insulating film 102 so as to cover the gate electrode 312 and to be located under the source electrode 313 and the drain electrode 314, and an inorganic protective film 104 and an organic protective film 105 are sequentially formed on the interlayer insulating film 103 so as to cover the source electrode 313 and the drain electrode 314.

The source electrode 313 and the drain electrode 314 are connected to the semiconductor layer 311 through contact holes CT formed in the interlayer insulating film 103 and the gate insulating film 102.

The organic protective film 105 is formed to have a thickness of 1 μm or more so as to eliminate height differences with the lower elements, and the surface of the organic protective film 105 can be even.

The reflective plates 110a, 110b and 110c, which are formed of aluminum (Al), an Al alloy, silver (Ag), an Ag alloy or Ag:Pb:Cu (APC) and are conductive, can be connected to the drain electrodes 314 through contact holes formed in the organic protective film 105 and the inorganic protective film 104.

In the display panel according to the present invention, light emitting parts GEM, BEM and REM of the respective subpixels G_SP, B_SP and R_SP can be divided by banks 260 configured to surround the respective light emitting parts GEM, BEM and REM. A trench can be formed partway through the total thickness of the organic protective film 105 between the banks 125 of the adjacent subpixels, thereby separating the subpixels from each other. In a small and highly integrated device, such as the display panel according to the present invention, the trenches T are provided to decrease deposition of organic matter of the organic layers of the subpixels corresponding to the vertical parts of the trenches T, thereby structurally separating the subpixels from each other.

Further, the banks 125 are formed of an inorganic film, such as an oxide film ($SiO_x$) or a nitride film ($SiN_x$). The reason for this is that, when the banks 125 are formed of an organic material, it is difficult to finely control the line width, and when the banks 125 are formed of an inorganic film, it is possible to finely adjust the line width in the range of several μm, particularly, a nanoscale line width in a higher resolution.

The configurations of the organic light emitting stack OS, the cathode 200, the capping layer 205, the encapsulation layer structure 2000 and the color conversion medium 240 and the materials of the first to third anodes 130a, 130b and 130c and the reflective plates 110a, 110b and 110c provided in the respective subpixels G_SP, B_SP and R_SP have been described above with reference to FIG. 1.

The light emitting parts GEM, BEM and REM of the respective subpixels G_SP, B_SP and R_SP can be defined as areas inside the banks 125.

Here, in the first to third subpixels G_SP, B_SP and R_SP, the organic light emitting stack OS having the same layer structure is provided between the first to third anodes 130a, 130b and 130c and the cathode 200, but the second anode 130b is disposed to contact the reflective plate 110b and the first and third anodes 130a and 130c are disposed to be spaced apart from the reflective plates 110a and 110b by the cavity adjustment layer 120, and thereby, wavelengths causing the microcavity effect are different.

Hereinafter, a display panel according to a second embodiment of the present invention will be described.

Figure 4:
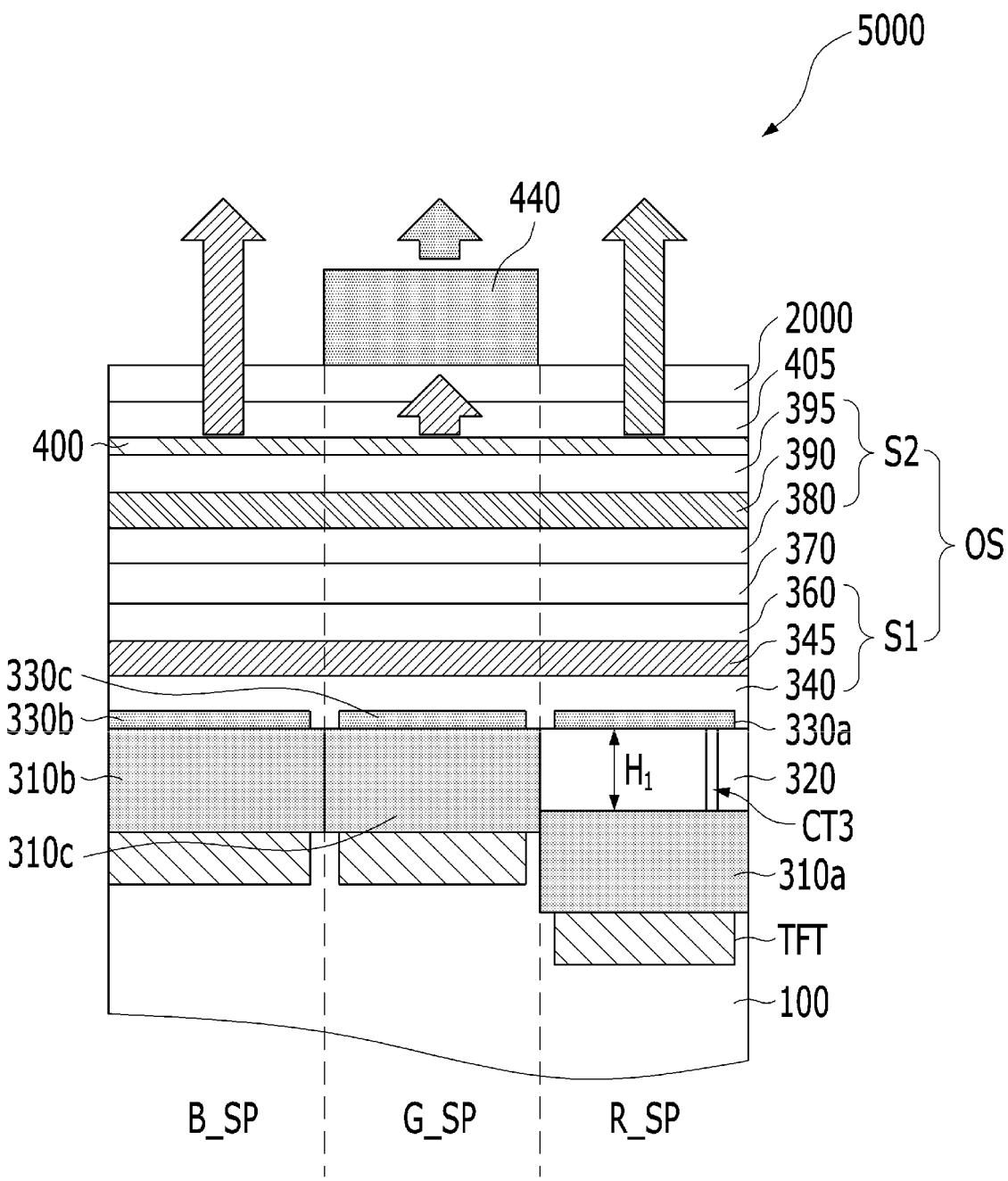
FIG. 4 is a cross-sectional view illustrating a display panel according to a second embodiment of the present invention.

FIG. 4 is a cross-sectional view illustrating the display panel according to the second embodiment of the present invention.

As shown in FIG. 4, a display panel 5000 according to the second embodiment of the present invention includes a substrate 100 having first to third subpixels R_SP, B_SP and G_SP, reflective plates 310a, 310b and 310c provided on the plate 100, a first anode 330a provided in the first subpixel R_SP and having a first distance $H_1$ from the reflective plate 310a, a second anode 330b provided in the second subpixel B_SP and contacting the reflective plate 310b, a third anode 330c provided in the third subpixel G_SP and contacting the reflective plate 310c, an organic light emitting stack OS provided on the first to third anodes 330a, 330b and 330c and including a plurality of stacks S1 and S2 respectively having light emitting layers 345 an 390 and a charge generation layer 370 interposed between the stacks S1 and S2, a cathode 250 provided on the organic light emitting stack OS, and a color conversion medium 440 provided on the cathode 250 located in the third subpixel G_SP.

In the display panel 5000 according to the second embodiment, the second subpixel B_SP is a blue subpixel in the same manner as in the first embodiment, and the first subpixel R_SP is a red subpixel and the third subpixel G_SP is a green subpixel, unlike the first embodiment.

The third subpixel G_SP having the color conversion medium 440 has a structure in which the reflective plate 310c and the third anode 330c contact each other, and emits blue light through the organic light emitting stack like the second subpixel B_SP having the same microcavity characteristics. Further, the color conversion member 440 converts light, having passed through the organic light emitting stack OS, the cathode 200, a capping layer 205 and an encapsulation layer structure 2000, into red light, and thereby, the third sub-pixel G_SP emits the red light.

In the same manner as in the first embodiment, in the display panel 5000 according to the second embodiment, the organic light emitting stack OS is formed in common in the first to third subpixels R_SP, B_SP and G_SP in a tandem manner, and in this case, the organic light emitting stack OS is not separated into the subpixels R_SP, B_SP and G_SP and thus respective common layers and light emitting layers can be formed using open masks having identical or similar openings at least in the active area of the substrate 100 without a fine metal mask (FMM).

In the display panel 5000 according to the second embodiment of the present invention, the organic light emitting stack OS includes a first common layer 340, the first light emitting layer 345, a second common layer 360, the charge generation layer 370, a third common layer 380, the second light emitting layer 390 and a fourth common layer 395, which are sequentially formed on the first to third anodes 330a, 330b and 330c.

The first common layer 340 and the third common layer 380 are layers relating to hole injection and/or hole transport, and serve to transmit holes to the first light emitting layer 345 and the second light emitting layer 390 adjacent thereto.

The second common layer 360 and the fourth common layer 395 are layers relating to electron injection and/or electron transport, and serve to transmit electrons to the first light emitting layer 345 and the second light emitting layer 390 adjacent thereto.

These first to fourth common layers 340, 360, 380 and 395 can include a plurality of layers based on the functions thereof. Further, in the display panel 5000 according to the present invention, not only the first to fourth common layers 340, 360, 380 and 395 having functions of injecting and transporting holes and electrons but also the first and second light emitting layers 345 and 390 and the charge generation layer 370 are formed integrally so as to cover the entirety of the subpixels R_SP, B_SP and G_SP rather than being separated into the subpixels R_SP, B_SP and G_SP.

Here, the respective stacks S1 and S2 mean units which are separated by the charge generation layer 370, and each of the stacks S1 and S2 includes the light emitting layer 345 or 390 and the common layers 340 and 360 or 380 and 395 provided on and under the light emitting layer 345 or 390.

In the example shown in FIG. 4, the first light emitting layer 345 can be a blue light emitting layer which emits light with a peak wavelength in the range of 435 nm to 475 nm, and the second light emitting layer 190 can be a red light emitting layer which emits light with a peak wavelength in the range of 600 nm to 650 nm. This is merely one example, the vertical positions of the blue light emitting layer and the red light emitting layer can be exchanged.

The color conversion medium 440 converts light emitted by the organic light emitting stack OS, particularly short wavelength light emitted by the first light emitting layer 345, into light having longer wavelengths and then emits the light. For example, the color conversion medium 440 functions to convert blue light emitted by the organic light emitting stack OS into green light. For example, light emitted by the third subpixel G_SP via the color conversion medium 440 can be light having a peak wavelength in the range of 500 nm to 590 nm, i.e., green light or yellowish-green light.

As stated in Table 2, it can be confirmed that, when the display panel according to the second embodiment of the present invention is set to a third test example and is compared to the above-described comparative example, light emitted by the red light emitting layer in the organic light emitting stack OS is used without a color filter and thus efficiency of red light is increased by 79%, and a color filter is omitted from the blue subpixel and thus efficiency of blue light is increased by 60% compared to the comparative example, similarly to the first embodiment. On the other hand, in the third test example to which the display panel according to the second embodiment of the present invention is applied, efficiency of green light is acquired by converting blue light emitted by the organic light emitting stack into green light without use of a green light emitting layer in the organic light emitting stack OS and thus has a difference with the efficiency of green light of the comparative example, but it can be confirmed that the efficiency of the display panel depending on whether or not material layers provided throughout the display panel absorb light is increased by 9% compared to the comparative example.

That is, in the display panel 5000 according to the second embodiment of the present invention, color filters are omitted, the phosphorescent light emitting stack in the organic light emitting stack includes a single phosphorescent light emitting layer, and the distance between the reflection plate and the cathode is adjusted, thereby increasing light emission efficiency.

TABLE 2

|  | Comparative example (condition 3) | Third test example |
|---|---|---|
| Efficiency of red light (Cd/A) | 17.3 | 31.1 |
| Efficiency of green light (Cd/A) | 46.5 | 37.2 |
| Efficiency of blue light (Cd/A) | 3.5 | 5.6 |
| Peak luminance (%) | 100% | 80% |
| Efficiency of panel (%) | 100% | 109% |

The above-described display panels according to the first and second embodiments of the present invention use the organic light emitting stack having the tandem structure. In this structure having a plurality of stacks, a plurality of organic layers can be stacked without a fine metal mask (FMM), and thus a yield can be improved. Particularly, each of the respective stacks in the organic light emitting stack uses a single light emitting layer, and thus, provision of emission areas is facilitated compared to the structure including different kinds of phosphorescent light emitting layers and thereby luminous efficacy is greatly improved.

Further, the display panel according to the present invention includes different kinds of light emitting layers in the organic light emitting stack and includes the color conversion medium provided at the exit side of the organic light emitting stack so as to convert light emitted by the organic light emitting stack into light of a color which the organic light emitting stack cannot emit, thereby simplifying the inner structure of the organic light emitting stack and improving luminance due to omission of color filters which limit light transmission intensity to about ⅓.

In addition, the display panel according to the present invention varies distances between the reflective plates and the anodes and thus implements emission of light of two colors through the resonance effect between the reflective plates and the cathode without color filters in two of the three subpixels, and converts light of a color, emitted by one of the two subpixels through the resonance effect between the reflective plate and the cathode, into light of another color in the remaining subpixel through the color conversion medium and then emits the converted light, thereby exhibiting the microcavity effect in the respective subpixels and maximizing optical efficiencies of the corresponding colors in the respective subpixels.

Hereinafter, various forms of a head mounted display device to which the above-described organic light emitting device array and the display panel using the same according to the present invention are applied will be described.

The display panel according to the present invention is applicable to all of the first embodiment shown in FIG. 1, the modified example of the first embodiment shown in FIG. 3, and the second embodiment shown in FIG. 4.

The head mounted display device according to the present invention can have any of various forms, i.e., a glasses type, a helmet type, and a band type.

Figure 5:
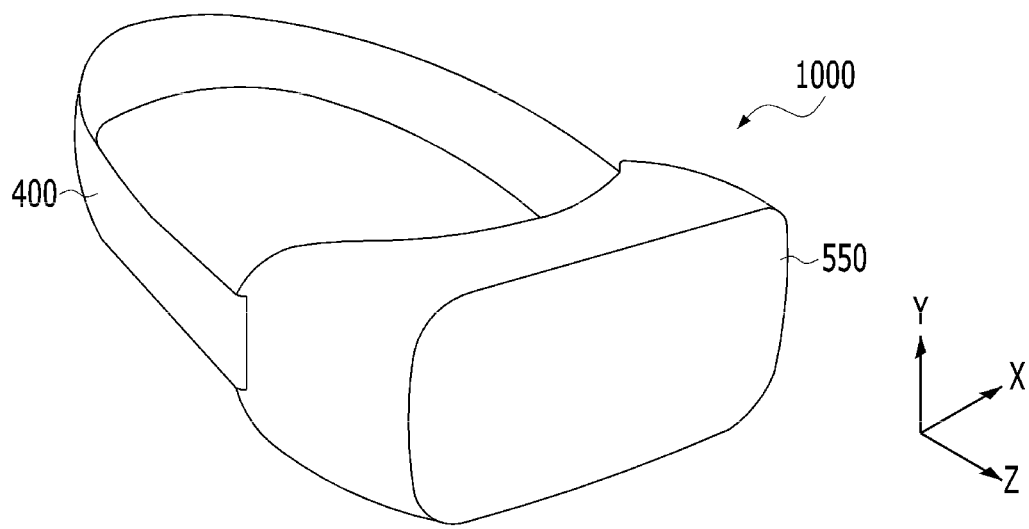
FIG. 5 is a perspective view of a first form of a head mounted display device according to an embodiment of the present invention.
Figure 6:
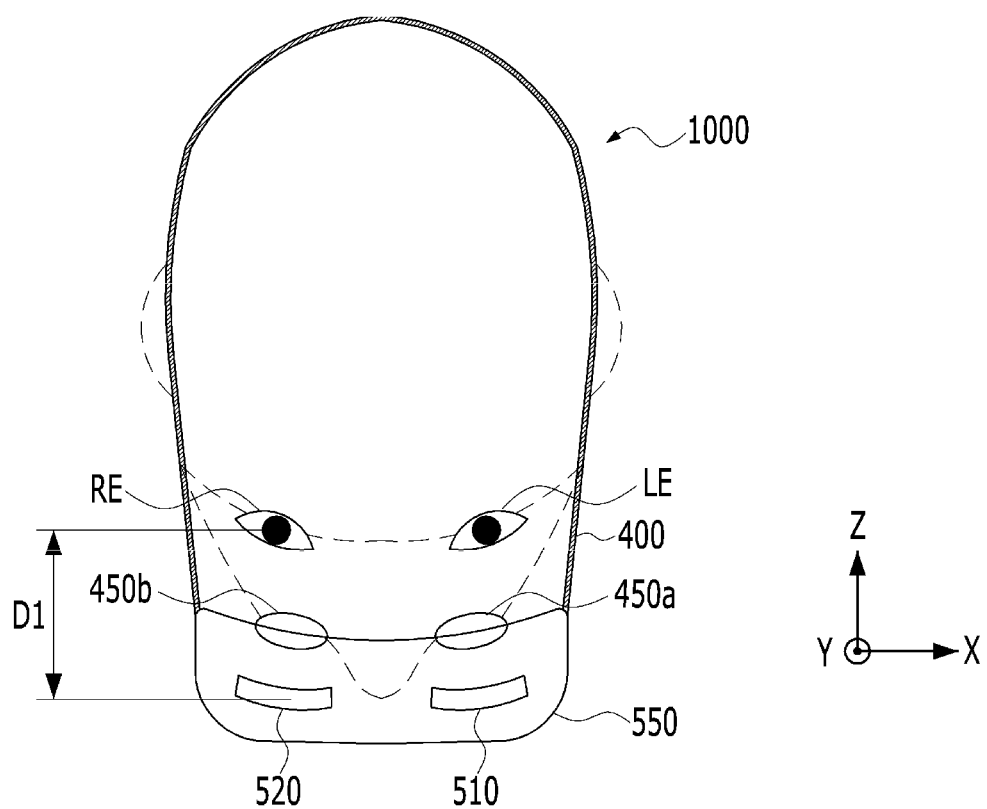
FIG. 6 is a top view of the head mounted display device of FIG. 5.

FIG. 5 is a perspective view of a first form of a head mounted display device according to the present invention, and FIG. 6 is a top view of the head mounted display device of FIG. 5.

As shown in FIGS. 5 and 6, the first form of the head mounted display device 1000 according to the present invention is a band type with which a viewer can view a virtual reality image.

A receiving structure 550 in which a first display panel 510 and a second display panel 520 corresponding to two viewer's eyes LE and RE are received is provided, and a first lens unit 450a and a second lens unit 450b which converge images from the first display panel 510 and the second display panel 520 on the viewer's eyes LE and RE are provided between the first display panel 510 and the viewer's left eye LE and between the second display panel 520 and the viewer's right eye RE.

In this case, even when the viewer's head moves, the head mounted display device 1000 is moved together with the movement of the viewer's head, and thus, the vertical distance D1 between the first display panel 510 and the viewer's left eye LE and between the second display panel 520 and the viewer's right eye RE is the same regardless of the movement of the viewer.

Therefore, when the viewer's left eye LE views the first display panel 510 and the viewer's right eye RE views the second display panel 520, the point of view is fixed, and thus, the viewer's left eye LE and right eye RE can view images from the first and second display panels 510 and 520 without a deviation in angles of view.

Figure 7:
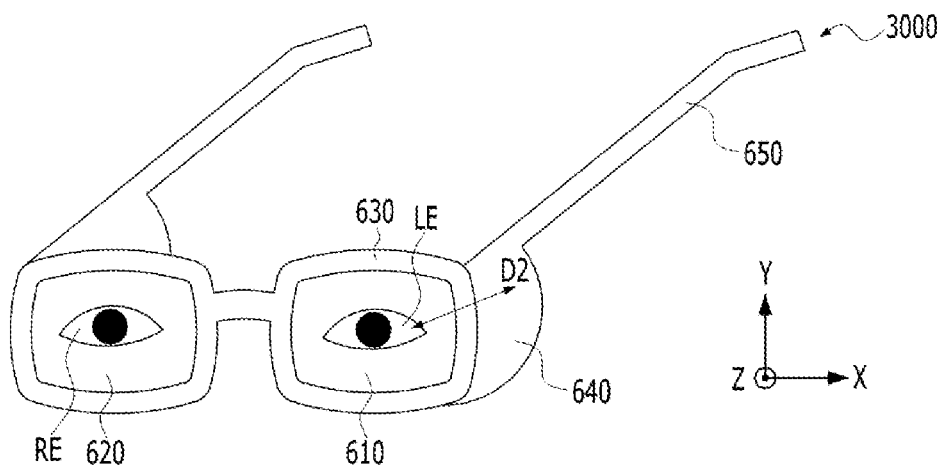
FIG. 7 is a perspective view of a second form of a head mounted display device according to an embodiment of the present invention.
Figure 8:
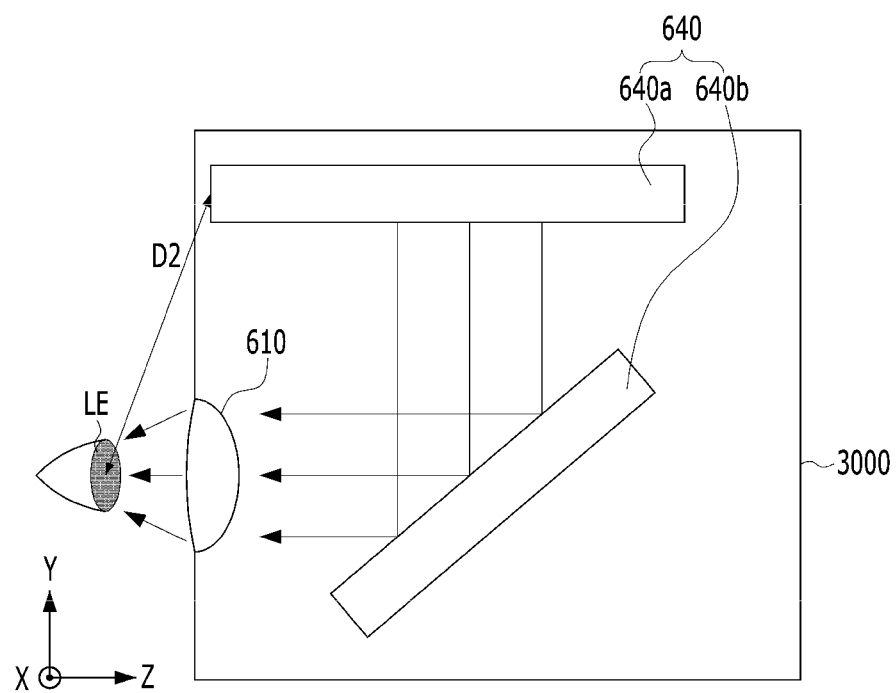
FIG. 8 is a view illustrating a relationship between the head mounted display device of FIG. 7 and a viewer's eye.

FIG. 7 is a perspective view of a second form of a head mounted display device according to the present invention, and FIG. 8 is a view illustrating the relationship between the head mounted display device of FIG. 7 and a viewer's eye.

As shown in FIGS. 7 and 8, the second form of the head mounted display device 3000 according to the present invention is a type corresponding to augmented reality, including transparent lens units 610 and 620 provided on front surface parts thereof, which viewer's eyes LE and RE view, so as to allow the viewer to view external environments, for example, a glasses type. However, the present invention is not limited thereto, and the transparent lens units 610 and 620 can be provided on the front surface of a helmet type or a band type, which viewer's eyes LE and RE view, so as to allow the viewer to view an augmented reality image while viewing external environments.

The second form of the head mounted display device 3000 according to the present invention includes first and second transparent lens units 610 and 620 configured to be separated from each other and provided on front surface parts thereof, which viewer's eyes LE and RE view, and a receiving structure including a rim 630 configured to surround the first and second transparent lenses 610 and 620, and hangers configured to extend from both sides of the rim 630 so as to be hung on view's both ears.

In addition, image transmission units 640, including display panels 640a located at the sides of the viewer's eyes LE and RE at the same oblique distance D2 from the viewer's eyes LE and RE and mirror-type reflectors 640b configured to transmit images from the display panels 640a to the transparent lenses 610 and 620, are mounted on the receiving structure 650.

An organic light emitting stack of the display panel 640a can include a first stack including a first light emitting layer configured to emit light of one color, and a second stack comprising a second light emitting layer configured to emit light of a different color from the color of the light emitted by the first light emitting layer.

A color conversion medium of the display panel 640a can convert light emitted by the organic light emitting stack into light having different wavelengths from wavelengths of the light emitted by the first and second light emitting layers.

The color conversion medium can convert the light emitted by the organic light emitting stack into light having longer wavelengths than wavelength of the light emitted by the first and second light emitting layers.

The display panel 640a can further include a cavity adjustment layer provided in second and third subpixels so as to form a first distance between reflection plates and second and third anodes.

The color conversion medium can transmit light of wavelengths provided between the wavelengths of the light emitted by the first light emitting layer and the wavelengths of the light emitted by the second light emitting layer.

The third anode can contact the reflective plate.

The color conversion medium can include a color conversion material and a resin layer configured to confine the color conversion material, and the color conversion material can include at least one selected from the group consisting of inorganic fluorescent substances, organic fluorescent substances, quantum dots and organic dyes.

The color conversion medium can include at least one of PbS, $PbS_2$, PbSe, CdSe, CdS, CdTe, InAs or InP.

The first stack can further include a first common layer provided under the first light emitting layer and a second common layer provided on the first light emitting layer, the second stack can further include a third common layer provided under the second light emitting layer and a fourth common layer provided on the second light emitting layer, the first light emitting layer can be a blue fluorescent light emitting layer, and the second light emitting layer can be a phosphorescent light emitting layer configured to emit light of longer wavelengths than the wavelengths of the light emitted by the first light emitting layer.

The first light emitting layer can emit light having a peak wavelength in a range of 435 nm to 475 nm, and the second light emitting layer can emit light having a peak wavelength in a range of 500 nm to 590 nm or light having a peak wavelength in a range of 600 nm to 650 nm.

In the first subpixel, the organic light emitting stack can emit the light, emitted by the first light emitting layer, as light of a single color having strong cavity characteristics through the cathode.

The display panel 640a can further include a capping layer and an encapsulation layer provided on the cathode in the first to third subpixels, and the color conversion medium can contact the upper surface of the encapsulation layer.

The first to third anodes can be transparent electrodes, and the cathode can be a transflective electrode The substrate can be one of a transparent glass substrate, a transparent plastic substrate and a silicon substrate.

The above-described display panel 640a can be used in a head mounted display device including a receiving structure configured to receive the display panel 640a.

As is apparent from the above description, a display panel and a head mounted display device using the same according to one or more embodiments of the present invention have the following effects and advantages.

First, in an organic light emitting stack having a tandem structure, in which a plurality of stacks is stacked, a plurality of organic layers can be stacked without a fine metal mask (FMM), and thus a yield can be improved. Particularly, each of the respective stacks in the organic light emitting stack uses a single light emitting layer, and thus, provision of emission areas is facilitated compared to a structure including different kinds of phosphorescent light emitting layers and thereby luminous efficacy is greatly improved.

Second, the display panel according to one or more embodiments of the present invention includes different kinds of light emitting layers in the organic light emitting stack and includes a color conversion medium provided at the exit side of the organic light emitting stack so as to convert light emitted by the organic light emitting stack into light of a color which the organic light emitting stack cannot emit, thereby simplifying the inner structure of the organic light emitting stack and improving luminance due to omission of color filters which limit light transmission intensity to about ⅓.

Third, the display panel according to one or more embodiments of the present invention varies distances between the reflective plates and the anodes and thus implements emission of light of two colors through the resonance effect between the reflective plates and the cathode without color filters in two of the three subpixels, and converts light of a color, emitted by one of the two subpixels through the resonance effect between the reflective plate and the cathode, into light of another color in the remaining subpixel through the color conversion medium and then emits the converted light, thereby exhibiting the microcavity effect in the respective subpixels and maximizing optical efficiencies of the corresponding colors in the respective subpixels.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display panel comprising:
a substrate configured to have first to third subpixels;
reflective plates on the substrate;
a first anode provided at the first subpixel and configured to have a first distance from a first reflective plate among the reflective plates;
a second anode provided at the second subpixel and configured to contact a second reflective plate among the reflective plates;
a third anode provided at the third subpixel and configured to contact a third reflective plate among the reflective plates or to have the first distance from the third reflective plate;
an organic light emitting stack over the first to third anodes, the organic light emitting stack comprising a plurality of stacks respectively having light emitting layers and a charge generation layer interposed between the plurality of stacks;
a cathode over the organic light emitting stack; and
a color conversion medium provided on the cathode at the third subpixel.

2. The display panel according to claim 1, wherein the organic light emitting stack comprises:
a first stack comprising a first light emitting layer configured to emit light of one color; and
a second stack comprising a second light emitting layer configured to emit light of a different color from the color of the light emitted by the first light emitting layer.

3. The display panel according to claim 2, wherein the color conversion medium converts light emitted by the organic light emitting stack into light having different wavelengths from wavelengths of the light emitted by the first and second light emitting layers, and then emits the converted light.

4. The display panel according to claim 2, wherein the color conversion medium converts light emitted by the organic light emitting stack into light having longer wavelengths than wavelengths of the light emitted by the first and second light emitting layers, and then emits the converted light.

5. The display panel according to claim 4, further comprising:
a cavity adjustment layer provided at the second and third subpixels to form the first distance between the reflection plates and the second and third anodes.

6. The display panel according to claim 2, wherein:
the first light emitting layer emits light having a peak wavelength in a range of approximately 435 nm to approximately 475 nm; and
the second light emitting layer emits light having a peak wavelength in a range of approximately 500 nm to approximately 590 nm or light having a peak wavelength in a range of approximately 600 nm to approximately 650 nm.

7. The display panel according to claim 6, wherein:
the third anode of the third subpixel is spaced apart from the third reflective plate by the first distance; and
the color conversion medium converts the light emitted by the first light emitting layer or the second light emitting layer into light of another color, and then emits the converted light.

8. The display panel according to claim 6, wherein:
the third anode of the third subpixel contacts the third reflective plate; and the color conversion medium converts the light emitted by the first light emitting layer into light of another color, and then emits the converted light.

9. The display panel according to claim 6, wherein the organic light emitting stack emits the light emitted by the first emitting layer, at the second subpixel.

10. The display panel according to claim 6, wherein the organic light emitting stack emits the light emitted by the second emitting layer, at the first subpixel.

11. The display panel according to claim 6, wherein:
the first stack further comprises a first common layer under the first light emitting layer and a second common layer on the first light emitting layer; and
the second stack further comprises a third common layer under the second light emitting layer and a fourth common layer on the second light emitting layer.

12. The display panel according to claim 1, wherein the color conversion medium comprises a color conversion material and a resin layer configured to confine the color conversion material, and
wherein the color conversion material comprises at least one of inorganic fluorescent substances, organic fluorescent substances, quantum dots and organic dyes.

13. The display panel according to claim 12, wherein the color conversion medium includes at least one of PbS, $PbS_2$, PbSe, CdSe, CdS, CdTe, InAs and InP.

14. The display panel according to claim 1, further comprising a capping layer and an encapsulation layer on the cathode at the first to third subpixels,
wherein the color conversion medium contacts an upper surface of the encapsulation layer.

15. The display panel according to claim 1, wherein:
the first to third anodes are transparent electrodes; and
the cathode is a transflective electrode.

16. The display panel according to claim 1, wherein the substrate is one of a transparent glass substrate, a transparent plastic substrate and a silicon substrate.

17. A head mounted display device comprising:
a display panel comprising:
a substrate configured to have first to third subpixels,
first, second and third reflective plates on the substrate,
a first anode provided at the first subpixel and configured to have a first distance from the first reflective plate,
a second anode provided at the second subpixel and configured to contact the second reflective plate,
a third anode provided at the third subpixel and configured to contact the third reflective plate or to have the first distance from the third reflective plate,
an organic light emitting stack over the first to third anodes, the organic light emitting stack comprising a plurality of stacks respectively having light emitting layers and a charge generation layer interposed between the plurality of stacks,
a cathode over the organic light emitting stack, and
a color conversion medium provided on the cathode at the third subpixel; and
a receiving structure configured to receive the display panel.

18. The head mounted display device according to claim 17, wherein the display panel comprises a first display panel unit and a second display panel unit separated from each other, and
the first display panel unit and the second display panel unit respectively correspond to a viewer's left and right eyes.

19. The head mounted display device according to claim 18, further comprising:
a first lens unit provided between the first display panel unit and the viewer's left eye to converge an image from the first display panel on the viewer's left eye; and
a second lens unit provided between the second display panel unit and the viewer's right eye to converge an image from the second display panel on the viewer's right eye.

20. The head mounted display device according to claim 18, wherein the first and second display panel units are provided to correspond to side parts of the viewer's left and right eyes in the receiving structure, and
wherein the head mounted display device further comprises:
first and second mirror-type reflectors configured to reflect images from the first and second display panel units, and
first and second lens units configured to converge images from the first and second mirror-type reflectors on the viewer's left and right eyes.

* * * * *